(12) United States Patent
Shinto et al.

(10) Patent No.: US 9,703,092 B2
(45) Date of Patent: Jul. 11, 2017

(54) OPTICAL FILTER INCLUDING A SUBSTRATE HAVING A GROOVE WITH A PAIR OF CURVED SURFACES AND ANALYTICAL INSTRUMENT

(71) Applicant: Seiko Epson Corporation, Tokyo (JP)

(72) Inventors: Susumu Shinto, Suwa (JP); Seiji Yamazaki, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/084,637

(22) Filed: Mar. 30, 2016

(65) Prior Publication Data

US 2016/0209638 A1 Jul. 21, 2016

Related U.S. Application Data

(62) Division of application No. 13/038,587, filed on Mar. 2, 2011, now abandoned.

(30) Foreign Application Priority Data

Mar. 19, 2010 (JP) .................................. 2010-063923

(51) Int. Cl.
*G02B 27/00* (2006.01)
*G02B 26/00* (2006.01)
(Continued)

(52) U.S. Cl.
CPC ........... *G02B 26/001* (2013.01); *G02B 5/284* (2013.01); *G02F 1/21* (2013.01); *G03F 7/70575* (2013.01); *G01J 3/26* (2013.01); *G02F 2001/213* (2013.01)

(58) Field of Classification Search
CPC ...... G02B 5/28; G02B 5/284; G02B 6/29358; G02B 5/285; G02B 5/288; G02B 26/001; G02B 26/007; G01J 3/26
(Continued)

(56) References Cited

U.S. PATENT DOCUMENTS 4,944,187 A 7/1990 Frick et al.
5,349,492 A 9/1994 Kimura et al.
(Continued)

FOREIGN PATENT DOCUMENTS

EP 2600191 A2 6/2013
JP 05-180719 7/1993
(Continued)

OTHER PUBLICATIONS

Duan, Xuefeng, "Microfabrication Using Bulk Wet Etching With TMAH," McGill University Master of Science, Aug. 31, 2005, pp. 4,5.

(Continued)

*Primary Examiner* — Arnel C Lavarias
(74) *Attorney, Agent, or Firm* — Harness, Dickey & Pierce, P.L.C.

(57) ABSTRACT

An optical filter includes: a lower substrate; a lower mirror provided to the lower substrate; a lower electrode provided to the lower substrate; an upper substrate disposed so as to be opposed to the lower electrode; an upper mirror provided to the upper substrate, and opposed to the lower mirror; and an upper electrode provided to the upper substrate, and opposed to the lower electrode, wherein the upper substrate has a groove surrounding the upper mirror in a plan view, the groove includes a first side surface section, a second side surface section, a bottom surface section, a first end section located between the first side surface section and the bottom surface section, and a second end section located between the second side surface section and the bottom surface section, in a cross-sectional view, and the first end section and the second end section each have a curved surface.

12 Claims, 6 Drawing Sheets

(51) Int. Cl.
  *G02B 5/28* (2006.01)
  *G02F 1/21* (2006.01)
  *G03F 7/20* (2006.01)
  *G01J 3/26* (2006.01)

(58) Field of Classification Search
  USPC ....... 359/578, 579, 577, 237, 238, 239, 290,
  359/291, 295; 356/450, 451, 454, 480,
  356/505, 506, 519
  See application file for complete search history.

(56) References Cited

U.S. PATENT DOCUMENTS

| | | | |
|---|---|---|---|
| 7,542,200 B1 | 6/2009 | Stowe | |
| 2002/0139770 A1 | 10/2002 | Katakura | |
| 2008/0278788 A1 | 11/2008 | Sasagawa | |
| 2009/0022946 A1 | 1/2009 | Hayashi et al. | |
| 2009/0207417 A1* | 8/2009 | Gibler ................ | G02B 6/322 |
| | | | 356/480 |

FOREIGN PATENT DOCUMENTS

| | | |
|---|---|---|
| JP | 06-075248 | 3/1994 |
| JP | 07-113708 | 5/1995 |
| JP | 07-249783 | 9/1995 |
| JP | 09-274860 | 10/1997 |
| JP | 2000-124117 A | 4/2000 |
| JP | 2002-299229 A | 10/2002 |
| JP | 2003185941 A * | 7/2003 |
| JP | 2004-281256 A | 10/2004 |
| JP | 2006-085096 A | 3/2006 |
| JP | 2006-208791 A | 8/2006 |
| JP | 2007-086517 A | 4/2007 |
| JP | 2008-088017 A | 4/2008 |
| JP | 2008-130937 A | 6/2008 |
| JP | 2009-244498 A | 10/2009 |
| JP | 2009-251105 A | 10/2009 |
| JP | 2010-008644 A | 1/2010 |
| WO | WO-2007-091657 A1 | 8/2007 |
| WO | WO-2008-008162 A2 | 1/2008 |

OTHER PUBLICATIONS

Extended European Search Report for Application No. EP 13 15 7164 dated Nov. 25, 2013 (9 pages).
Xuefeng, Duan, "Microfabrication Using Bulk Wet Etching With TMAH", McGill University, Thesis for Master of Science, Aug. 31, 2005, pp. 1-103.
Extended European Search Report for Application No. EP 15 18 5426 dated Jan. 20, 2016 (8 pages).

* cited by examiner

OPTICAL FILTER INCLUDING A SUBSTRATE HAVING A GROOVE WITH A PAIR OF CURVED SURFACES AND ANALYTICAL INSTRUMENT

CROSS-REFERENCE TO RELATED APPLICATIONS

This application is a divisional of U.S. patent application Ser. No. 13/038,587 filed on Mar. 2, 2011. This application claims the benefit of Japanese Patent Application No. 2010-063923 filed Mar. 19, 2010. The disclosures of the above applications are incorporated herein by reference.

BACKGROUND

1. Technical Field

The present invention relates to an optical filter and an analytical instrument.

2. Related Art

In the past, as an optical filter for selecting a light beam having a target wavelength from the incident light beams and then emitting the light beam, there has been known an optical filter of an air-gap type and of an electrostatic-drive type, in which a pair of substrates are disposed so as to be opposed to each other, each of the surfaces of the substrates opposed to each other is provided with a mirror, electrodes are respectively disposed in the peripheries of the mirrors, a diaphragm section is disposed in the periphery of one of the mirrors, and the diaphragm section is displaced due to electrostatic force generated between the electrodes to thereby vary the gap (air gap) between the mirrors, thus taking out the light beam having a desired wavelength (e.g., JP-A-2003-57438).

In such an optical filter, it is required to control a gap between the pair of mirrors in an extremely narrow range such as a sub-micron range through a range of several microns in the manufacturing process, and moreover, it is important to keep the gap between the mirrors with accuracy, and at the same time, to control the gap to have a desired gap amount.

Incidentally, in the optical filter of the air-gap type and of the electrostatic-drive type, the diaphragm is moved by electrostatic attractive force to thereby vary the gap between the mirrors. Therefore, it results that the applied voltage for generating the electrostatic attractive force necessary for the displacement of the gap varies in accordance with the thickness of the diaphragm section. Therefore, it is desirable for the diaphragm section to be as thin as possible in order for holding down the applied voltage. However, thinning the diaphragm section causes degradation of strength, and in the optical filter repeatedly varying the gap stress is applied to the diaphragm section every time the gap is varied, and therefore, there arises a problem that the degradation of strength directly causes breakage of the diaphragm section.

SUMMARY

An advantage of some aspects of the invention is to provide an optical filter and an optical module equipped with the optical filter each capable of preventing the degradation of strength of the diaphragm section even in the case of thinning the diaphragm section on the ground of holding down the applied voltage, and as a result, enhancing the strength of the diaphragm section while reducing the maximum applied voltage, varying the gap stably, and being driven preferably.

According to an aspect of the invention, there is provided an optical filter including a lower substrate, a lower mirror provided to the lower substrate, a lower electrode provided to the lower substrate, an upper substrate disposed so as to be opposed to the lower substrate, an upper mirror provided to the upper substrate, and opposed to the lower mirror, and an upper electrode provided to the upper substrate, and opposed to the lower electrode, wherein the upper substrate has a groove surrounding the upper mirror in a plan view, the groove has a first side surface section, a second side surface section, a bottom surface section, a first end section located between the first side surface section and the bottom surface section, and a second end section located between the second side surface section and the bottom surface section, in a cross-sectional view, and the first end section and the second end section each have a curved surface.

The optical filter according to this aspect of the invention has a curved surface in each of the end sections of the groove. Thus, the stress concentration to the end sections of the groove caused when varying the gap can be eased to thereby enhance the strength of the diaphragm section. As a result, a stable gap variation becomes possible, and it becomes possible to preferably drive the gap.

According to another aspect of the invention, in the optical filter described above, the bottom surface section is flat, and the upper electrode is disposed on the upper substrate within a region located under the bottom surface section in the plan view.

Thus, it becomes possible to prevent a crack or the like in the upper electrode due to the distortion of the groove from occurring.

According to another aspect of the invention, in the optical filter described above, the first end section is located nearer to the upper mirror, and the first end section fails to overlap the upper mirror in the plan view.

Thus, it is possible to prevent the propagation of the light beam entering the upper mirror from being blocked by the side surface sections of the diaphragm, thereby making preferable sensing possible.

According to another aspect of the invention, in the optical filter described above, the lower substrate and the upper substrate each have a light transmissive property.

By arranging that the first and second substrates each have a light transmissive property as described above, the transmittance of the light beam in the substrate is improved, and the strength of the light beam taken out is also raised. Therefore, the efficiency of taking out the light beam is improved.

According to another aspect of the invention, in the optical filter described above, the groove is formed by performing a wet-etching process after performing a dry-etching process.

By using the wet-etching process in the manufacturing process, it becomes easy to provide a curved surface shape to the end section, thereby making it possible to ease the stress concentration to the end sections, and thus the strength of the diaphragm section can be improved. Further, by combining the dry-etching process and the wet-etching process with each other, it becomes possible to reduce the time necessary for forming the groove, and at the same time to provide a structure in which the end sections of the groove each have a curved surface, thus the stress concentration to the end sections can be eased to thereby improve the strength of the diaphragm section. As a result, a stable gap variation becomes possible, and preferable drive becomes possible.

According to another aspect of the invention, there is provided an analytical instrument using any one of the optical filters described above.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Hereinafter, an optical filter according to an embodiment of the invention will be explained. Here, as the optical filter, an optical filter of an air-gap type and of an electrostatic-drive type will be explained.

Figure 1:
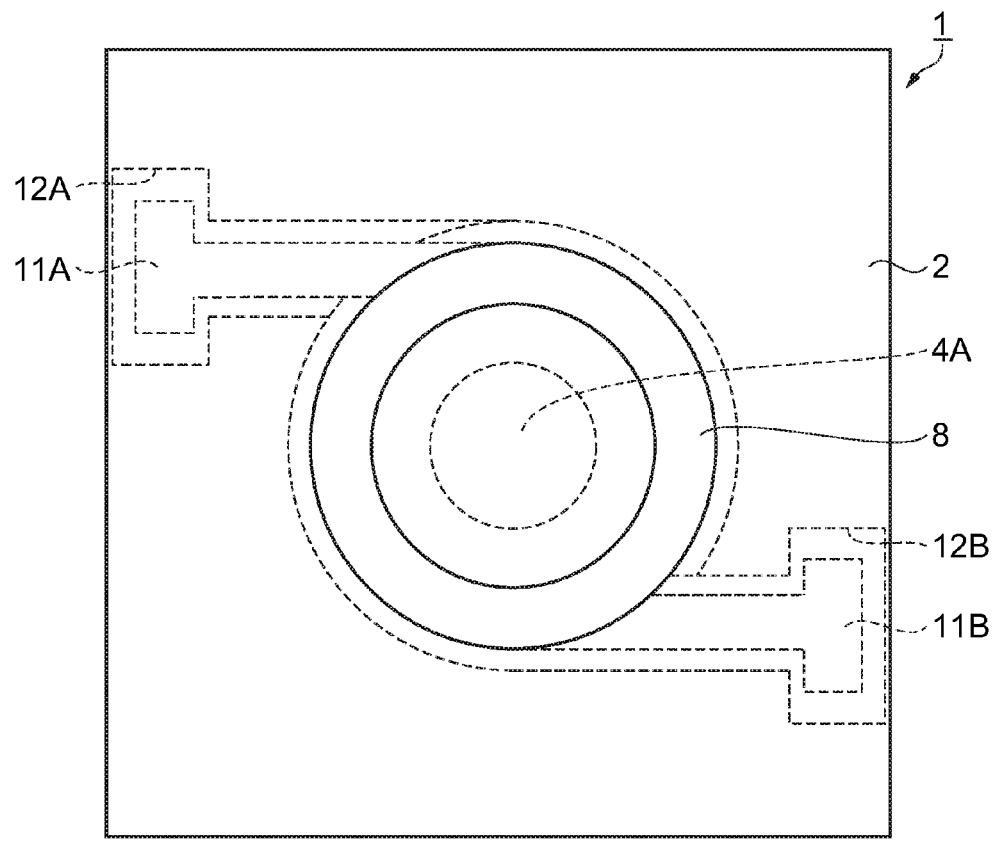
FIG. 1 is a plan view of an optical filter according to an embodiment of the invention.
Figure 2:
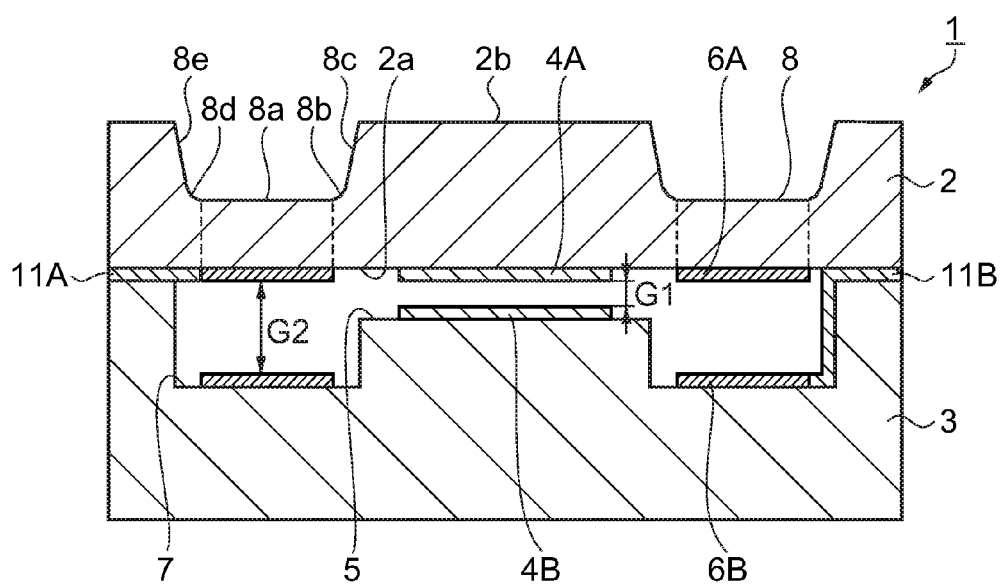
FIG. 2 is a cross-sectional view of the optical filter according to the embodiment.

In FIGS. 1 and 2, the reference numeral 1 denotes an optical filter of the air-gap type and of the electrostatic-drive type. The optical filter 1 is composed of an upper substrate 2, a lower substrate 3 bonded (or joined with an adhesive) to the upper substrate 2 in the state of being opposed thereto, a mirror 4A (an upper mirror) having a circular shape disposed at a central portion of an opposed surface 2a of the upper substrate 2, the opposed surface 2a being opposed to the lower substrate 3, a mirror 4B (a lower mirror) having a circular shape disposed at a central portion of a bottom surface of a first recessed section 5 formed at a central portion of a surface of the lower substrate 3, the surface being opposed to the upper substrate 2, so as to be opposed to the mirror 4A via a first gap G1, an electrode 6A (an upper electrode) having a ring shape disposed in the periphery of the mirror 4A of the upper substrate 2, an electrode 6B (a lower electrode) having a ring shape disposed in a second recessed section 7 having a ring shape formed in the periphery of the first recessed section 5 of the lower substrate 3 so as to be opposed to the electrode 6A via a second gap G2, and a thin-wall and ring-shaped diaphragm section 8 provided to an opposite surface of the upper substrate 2 to the opposed surface 2a thereof, and formed at the position roughly corresponding to the electrode 6A using an etching (selectively removing) process.

The diaphragm section 8 is composed of a first side surface section 8c, a second side surface section 8e, a bottom surface section 8a, a first end section 8b located between the first side surface section 8c and the bottom surface section 8a, and a second end section 8d located between the second side surface section 8e and the bottom surface section 8a. Further, the first side surface section 8b located near to the mirror 4A in the diaphragm section 8 is formed so as not to overlap the mirror 4A in a plan view. By adopting such a structure as described above, it is possible to prevent the propagation of the light beam entering the mirror 4A from being blocked by the first side surface section 8c of the diaphragm section 8.

Further, the electrodes 6A, 6B disposed so as to be opposed to each other via the second gap G2 and the diaphragm 8 constitute an electrostatic actuator.

As the material of the upper substrate 2 and the lower substrate 3, glass can be used. As the glass, specifically, soda glass, crystallized glass, quartz glass, lead glass, potassium glass, borosilicate glass, sodium borosilicate glass, alkali-free glass, and so on are preferably used.

By using a material having a light transmissive property for both of the upper substrate 2 and the lower substrate 3, electromagnetic waves in a desired wavelength band or visible light can be used as the incident light.

Further, by forming both of the upper substrate 2 and the lower substrate 3 using a semiconductor material such as silicon, near infrared light can be used as the incident light.

The mirrors 4A, 4B are disposed so as to be opposed to each other via the first gap G1, and are each composed of a dielectric multilayer film having high-refractive index layers and low-refractive index layers stacked alternately to each other. It should be noted that the mirrors 4A, 4B are not limited to the dielectric multilayer films, but alloy films having silver as a principal constituent or multilayer films thereof, for example, can also be used.

Out of these mirrors 4A, 4B, one 4A of the mirrors is provided to the upper substrate 2, which is deformable, and is therefore called a movable mirror, and the other 4B of the mirrors is disposed to the lower substrate 3, which is undeformable, and is therefore called a fixed mirror in some cases.

In the case of using the optical filter 1 in the visible light region or the infrared light region, as the material of forming the high-refractive index layers in the dielectric multilayer film, titanium oxide ($Ti_2O$), tantalum oxide ($Ta_2O_5$), niobium oxide ($Nb_2O_5$), and so on can be used. Further, in the case of using the optical filter 1 in the ultraviolet light region, as the material of forming the high-refractive index layers, aluminum oxide ($Al_2O_3$), hafnium oxide ($HfO_2$), zirconium oxide ($ZrO_2$), thorium oxide ($ThO_2$), and so on can be used.

On the other hand, as the material for forming the low-refractive index layer in the dielectric multilayer film, magnesium fluoride ($MgF_2$), silicon oxide ($SiO_2$), and so on can be used.

The number of layers and thickness of the high-refractive index layers and the low-refractive index layers are appropriately set based on the necessary optical characteristics. In general, in the case of forming a reflecting film (a mirror) with a dielectric multilayer film, the number of layers necessary for obtaining the optical characteristics is equal to or larger than 12.

The electrodes 6A, 6B are disposed so as to be opposed to each other via the second gap G2, and for constituting a part of the electrostatic actuator for generating electrostatic force between the electrode 6A, 6B in accordance with the drive voltage input thereto to thereby move the mirrors 4A, 4B relatively to each other in the state in which the mirrors are opposed to each other.

Thus, the electrodes 6A, 6B are arranged to displace the diaphragm section 8 in a vertical direction in FIG. 2 to vary the first gap G1 between the mirrors 4A, 4B, thereby emitting the light beam with a wavelength corresponding to the first gap G1.

Further, as shown in FIG. 2, the electrode 6A is disposed within a region located under the bottom surface section 8a, which is a flat plane. If the electrode 6A is formed to overlap the first end section 8b and the second end section 8d each having a curved surface, when driving the diaphragm section 8, the diaphragm section 8 is distorted to cause large stress in the electrode 6A located under the first end section 8b and the second end section 8d. Thus, there is a possibility that a problem such as a crack arises in the electrode 6A. However, by forming the electrode 6A within the region under the bottom surface section 8a which is a flat plane, the crack and so on of the electrode 6A due to the distortion of the diaphragm section 8 can be prevented.

It should be noted that since in the present embodiment the opposed surface 2a of the upper substrate 2 and the second recessed section 7 provided to the lower substrate 3 are arranged to be parallel to each other, the electrodes 6A, 6B are also parallel to each other.

It is sufficient for the material for forming the electrodes 6A, 6B to be conductive, and the material is not particularly limited. However, metal such as Cr, Al, Al alloy, Ni, Zn, Ti, or Au, resin having carbon or titanium dispersed, silicon such as polycrystalline silicon (polysilicon) or amorphous silicon, or a transparent conductive material such as silicon nitride or ITO can be used as the material.

As shown in FIG. 1, wiring lines 11A, 11B are connected respectively to the electrodes 6A, 6B, and the electrodes 6A, 6B are connected to a power supply (not shown) via the wiring lines 11A, 11B.

It should be noted that the wiring lines 11A, 11B are formed in a wiring groove 12A provided to the upper substrate 2 or a wiring groove 12B provided to the lower substrate 3. Therefore, it is arranged that the wiring lines do not interfere the bonding between the upper substrate 2 and the lower substrate 3.

The power supply is for applying a voltage to the electrodes 6A, 6B as a drive signal to thereby drive the electrodes 6A, 6B, thus generating desired electrostatic force between the electrodes 6A, 6B. It should be noted that a control device (not shown) is connected to the power supply, and it is arranged that by controlling the power supply using the control device, the electrical potential difference between the electrodes 6A, 6B can be adjusted.

The diaphragm section 8 has a smaller thickness compared to a portion of the upper substrate 2 where the diaphragm section 8 is not formed. The portion of the upper surface 2 with a smaller thickness compared to the other portion of the upper substrate 2 as described above is arranged to be deformable (displaceable) with elasticity (flexibility), and thus, the diaphragm section 8 is arranged to have a wavelength selection function for varying the first gap G1 to change the distance between the mirrors 4A, 4B to a distance corresponding to a light beam with a desired wavelength, thereby outputting the light beam with the desired wavelength.

The shape and the thickness of the diaphragm section 8 are not particularly limited providing the light beams having wavelengths within a desired wavelength range can be output, and are specifically set in accordance with the wavelength range of the output light beam required for the optical filter 1 taking the variation amount, the variation speed, and so on of the distance between the mirrors 4A, 4B into consideration.

Figure 3:
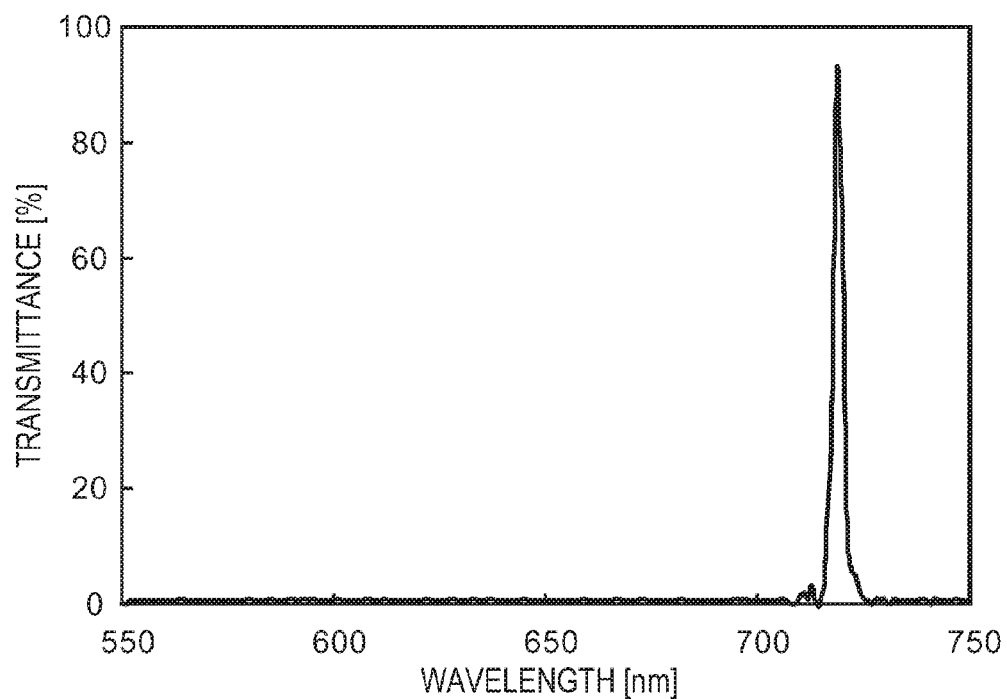
FIG. 3 is a diagram showing a relationship between the wavelength and the transmittance in the case of applying no voltage in the optical filter according to the embodiment.

In the optical filter 1 according to the present embodiment, in the case in which the control device and the power supply are not driven, and therefore, no voltage is applied between the electrodes 6A, 6B, the mirror 4A and the mirror 4B are opposed to each other via the first gap G1. Therefore, when a light beam enters the optical filter 1, it results that the light beam with the wavelength corresponding to the first gap G1, for example, the light beam with the wavelength of 720 nm is output as shown in FIG. 3.

Here, when driving the control device and the power supply to apply a voltage between the electrodes 6A, 6B, the electrostatic force corresponding to the level of the voltage (electrical potential difference) is generated between the electrodes 6A, 6B. As described above, the control device controls the power supply to thereby apply a desired voltage between the electrodes 6A, 6B, thus making it possible to generate desired electrostatic force between the electrodes 6A, 6B. When the desired electrostatic force is generated between the electrodes 6A, 6B in such a manner as described above, the electrodes 6A, 6B are attracted to each other due to the electrostatic force to thereby deform the upper substrate 2 toward the lower substrate 3, and thus the first gap G1 between the mirrors 4A, 4B is narrowed compared to the case in which no voltage is applied.

On this occasion, the stress is caused in the first end section 8b and the second end section 8d by the movement of the diaphragm section 8 due to the electrostatic force. However, according to the present embodiment, since the first end section 8b and the second end section 8d each have a shape with a large curvature radius, it becomes difficult to cause the stress concentration, the breakage is hardly caused even by repeated drive of the diaphragm section 8, and thus preferable drive is repeated.

Figure 4:
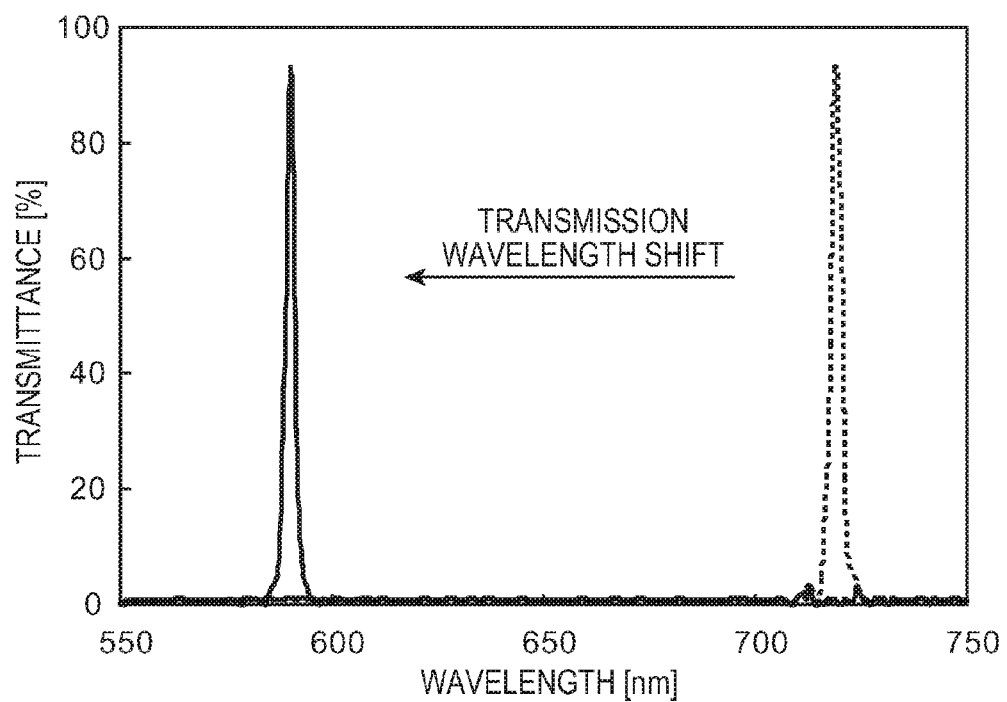
FIG. 4 is a diagram showing a relationship between the wavelength and the transmittance in the case of applying a voltage in the optical filter according to the embodiment.

Therefore, when a light beam enters the optical filter 1, it results that the light beam with the wavelength corresponding to the displaced first gap G1, for example, the light beam with the wavelength of 590 nm is output, and the transmission wavelength is shifted toward a shorter wavelength as shown in FIG. 4.

Then, a method of manufacturing the optical filter 1 according to the present embodiment will be explained with reference to the accompanying drawings. FIGS. 5A through 5C, 6A, 6B, 7A through 7C, 8A through 8C, 9A, and 9B are cross-sectional views showing a method of manufacturing the optical filter 1 according to the present embodiment.

The manufacturing method includes a manufacturing process of the upper substrate and a manufacturing process of the lower substrate. Hereinafter, each of the processes will sequentially be described.

1. Manufacturing Process of Upper Substrate

Figure 5A:
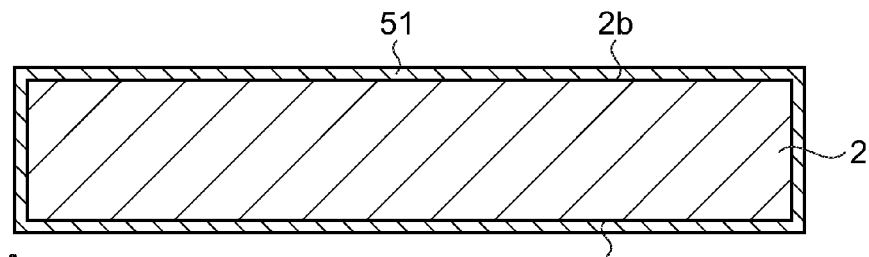
FIGS. 5A through 5C are diagrams for explaining a method of manufacturing the optical filter according to the embodiment.

A shown in FIG. 5A, a mask layer 51 is deposited on the entire surface of the upper substrate 2. As a material for composing the mask layer 51, for example, a metal film made of Cr/Au or the like can be used. The thickness of the mask layer 51 is not particularly limited, but is preferably set to about 0.01 through 1 µm, further preferably about 0.1 through 0.3 µm. If the mask layer 51 is too thin, the upper substrate 2 may not sufficiently be protected, and if the mask layer 51 is too thick, the mask layer 51 may become easy to be peeled off due to the internal stress of the mask layer 51. In the present embodiment, a Cr/Au film is deposited as the mask layer 51 by a sputtering process to have a thickness of the Cr layer of 0.01 μm and a thickness of the Au layer of 0.3 μm.

Figure 5B:
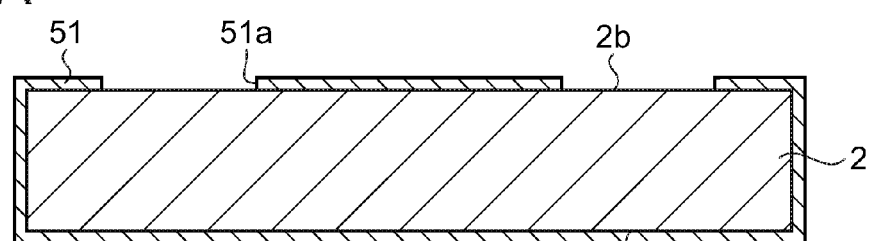

Subsequently, as shown in FIG. 5B, an opening section 51a for forming the diaphragm section 8 is provided to the mask layer 51. The opening section 51a can be formed by, for example, a photolithography process. Specifically, a resist layer (not shown) having a pattern corresponding to the opening section 51a is formed on the mask layer 51, and then the mask layer 51 is removed partially using the resist layer as a mask, and then the resist layer is removed to thereby form the opening section 51a. It should be noted that the partial removal of the mask layer 51 is performed by a wet-etching process or the like.

Figure 5C:
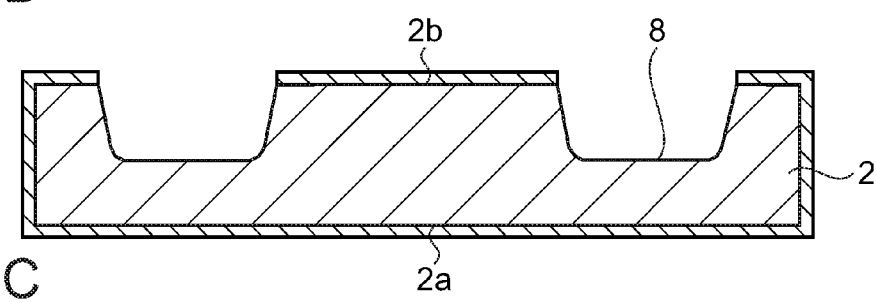

Subsequently, as shown in FIG. 5C, the upper substrate 2 is etched by a wet-etching process to thereby form the diaphragm section 8. As an etching fluid, hydrofluoric acid or buffered hydrofluoric acid (BHF), for example, can be used. Further, alternatively, the diaphragm section 8 can be formed by performing a wet-etching process after performing a dry-etching process. According to this configuration, it is possible to reduce the time necessary for processing the groove, and at the same time to form the structure in which the first end section 8b and the second end section 8d of the groove each have a curved surface, which makes it possible to ease the stress concentration to the end sections to thereby enhance the strength of the diaphragm section 8.

Figure 6A:
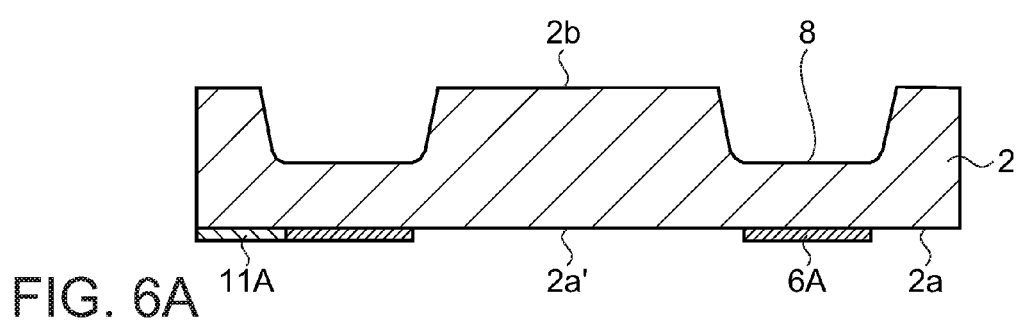
FIGS. 6A and 6B are diagrams for explaining the method of manufacturing the optical filter according to the embodiment.
Figure 6B:
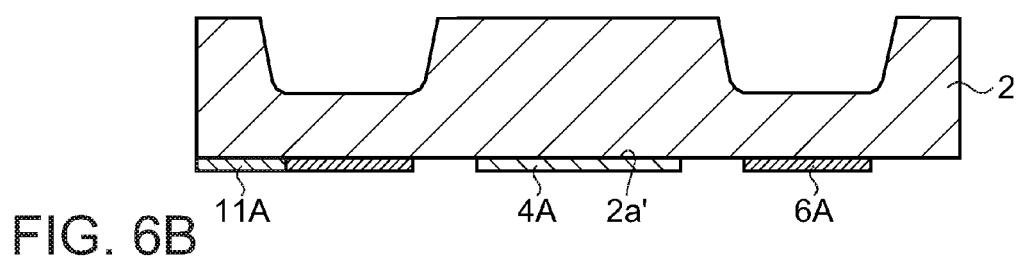

Subsequently, as shown in FIG. 6A, the electrode 6A and the wiring line 11A are formed. As a material for forming the electrode 6A and the wiring line 11A, a metal film made of, for example, Cr, Al, or a transparent conductive material such as ITO can be used. The thickness of the electrode 6A and the wiring line 11A is preferably set to, for example, 0.1 through 0.2 μm.

In order for forming the electrode 6A and the wiring line 11A, the metal film or the like is deposited by a vapor deposition process, a sputtering process, an ion-plating process or the like, and then the film is patterned by a photolithography process and an etching process.

Subsequently, the mirror 4A is formed at a position 2a' on the opposed surface 2a surrounded by the diaphragm section 8. For example, titanium oxide (Ti$_2$O) as a material for forming the high-refractive index layer and silicon oxide (SiO$_2$) as a material for forming the low-refractive index layer are stacked to each other, and then these layers are patterned by a liftoff process to thereby obtain the mirror 4A.

2. Manufacturing Process of Lower Substrate

Figure 7A:
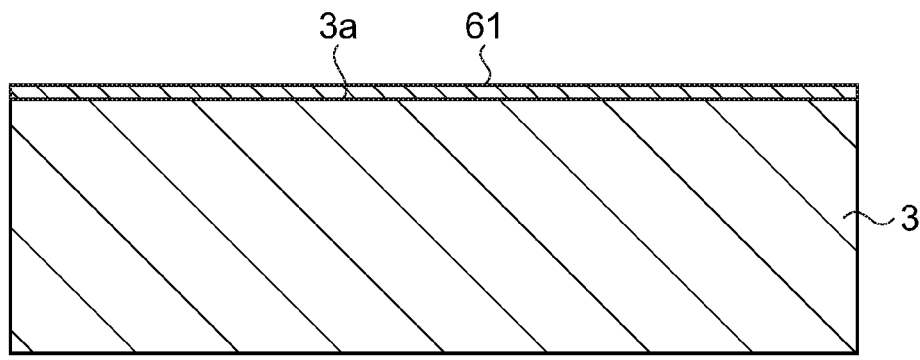
FIGS. 7A through 7C are diagrams for explaining the method of manufacturing the optical filter according to the embodiment.

As shown in FIG. 7A, a mask layer 61 is deposited on the opposed surface 3a of the lower substrate 3 opposed to the upper substrate 2. As a material for forming the mask layer 61, a typical resist material is used.

Figure 7B:
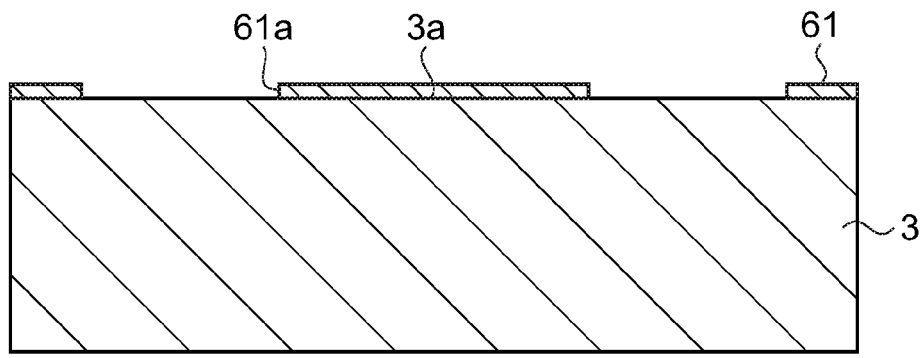

Subsequently, as shown in FIG. 7B, an opening section 61a for forming the second recessed section 7 is provided to the mask layer 61. The opening section 61a can be formed by a photolithography process.

Figure 7C:
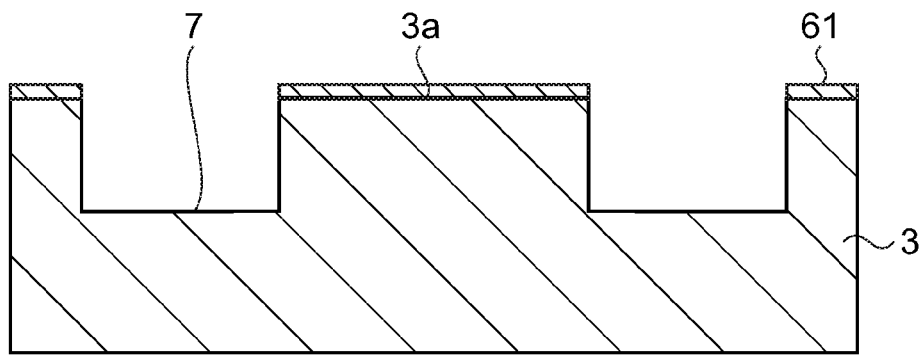

Subsequently, as shown in FIG. 7C, the lower substrate 3 is etched by a wet-etching process to form the second recessed section 7. As an etching fluid, hydrofluoric acid or buffered hydrofluoric acid (BHF), for example, can be used. It should be noted that the method of forming the second recessed section 7 is not limited to the wet-etching process, but other etching processes such as a dry-etching process can also be used.

Figure 8A:
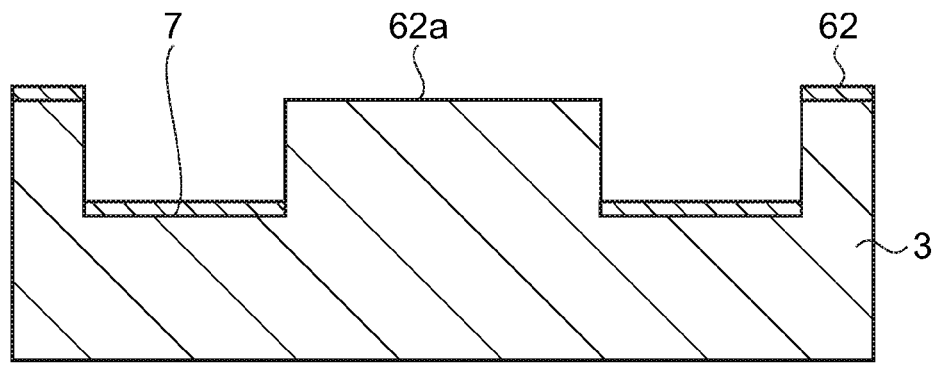
FIGS. 8A through 8C are diagrams for explaining the method of manufacturing the optical filter according to the embodiment.
Figure 8B:
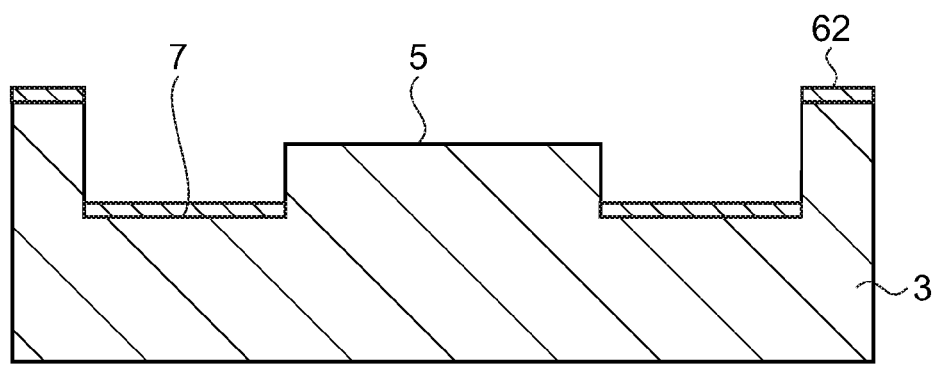
Figure 8C:
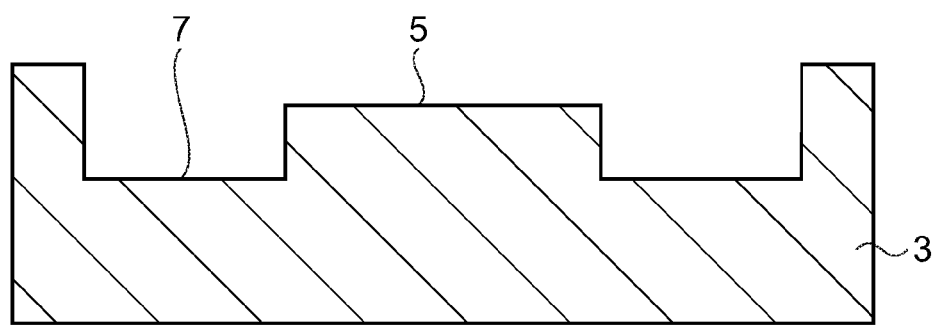

Subsequently, after removing the mask layer 61 by the etching process, the first recessed section 5 is then formed in the same manner as the formation of the second recessed section 7. Specifically, a mask layer 62 is deposited on the lower substrate 3, as shown in FIG. 8A, to thereby form an opening section 62a for forming the first recessed section 5. Subsequently, as shown in FIG. 8B, the lower substrate 3 is etched by a wet-etching process to form the first recessed section 5. Then, as shown in FIG. 8C, by removing the mask layer 62 by the etching process, the lower substrate 3 provided with the first and second recessed sections 5, 7 can be obtained.

Figure 9A:
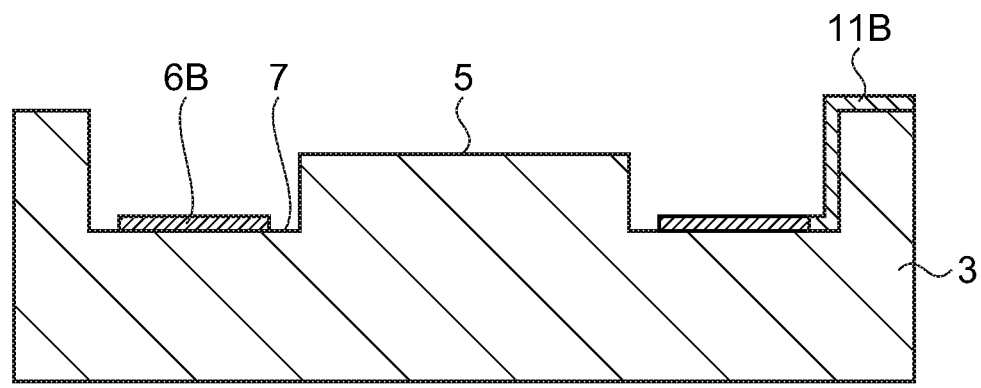
FIGS. 9A and 9B are diagrams for explaining the method of manufacturing the optical filter according to the embodiment.
Figure 9B:
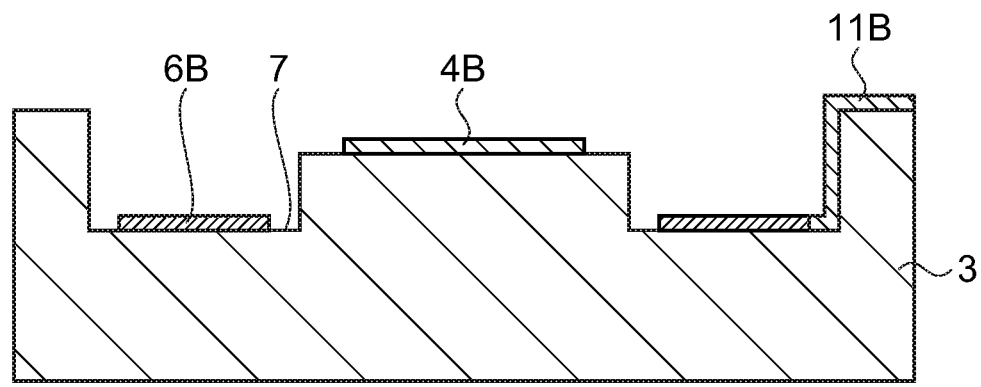

Subsequently, as shown in FIG. 9A, the electrode 6B and the wiring line 11B are formed. As a material for forming the electrode 6B and the wiring line 11B, a metal film made of, for example, Cr, Al, or a transparent conductive material such as ITO can be used. The thickness of the electrode 6B and the wiring line 11B is preferably set to, for example, 0.1 through 0.2 μm.

In order for forming the electrode 6B and the wiring line 11B, the metal film or the like is deposited by a vapor deposition process, a sputtering process, an ion-plating process or the like, and then the film is patterned by a photolithography process and an etching process.

Then, the mirror 4B is formed at a position opposed to the mirror 4A disposed on the upper substrate 2. For example, titanium oxide (Ti$_2$O) as a material for forming the high-refractive index layer and silicon oxide (SiO$_2$) as a material for forming the low-refractive index layer are stacked to each other, and then these layers are patterned by a liftoff process to thereby obtain the mirror 4B.

As explained hereinabove, according to the optical filter of the present embodiment, when varying the first gap G1 in order for selectively taking out the wavelength, the stress is caused in the first end section 8b and the second end section 8d by the movement of the diaphragm section 8. However, according to the present embodiment, since the first end section 8b and the second end section 8d each have a shape with a large curvature radius, it becomes difficult to cause the stress concentration, the breakage is hardly caused even by repeated drive of the diaphragm section 8, and thus preferable drive is repeated.

It should be noted that the optical filter according to the invention can be applied to an analytical instrument such as a colorimeter for measuring colors or a gas detector for measuring gasses.

The entire disclosure of Japanese Patent Application No. 2010-063923, filed Mar. 19, 2010 is expressly incorporated by reference herein.

What is claimed is:
1. An optical filter comprising:
   a first glass substrate;
   a second glass substrate that is disposed so as to oppose the first substrate;
   a first mirror that is disposed between the first glass substrate and the second glass substrate;
   a second mirror that is disposed between the first mirror and the second glass substrate;
   a first electrode that is disposed between the first glass substrate and the second glass substrate; and
   a second electrode that is disposed between the first electrode and the second glass substrate,
   the second glass substrate having a groove that surrounds the second mirror when viewed from a second glass substrate side to a first glass substrate side,
   the groove including a first side surface, a second side surface, a bottom surface, a first curved surface located between the first side surface and the bottom surface, and a second curved surface located between the second side surface and the bottom surface, the first curved surface being configured for easing a first stress concentration of the second glass substrate that is located between the first side surface and the bottom surface and that is generated during application of a voltage between the first electrode and the second electrode, the second curved surface being configured for easing a second stress concentration of the second glass substrate that is located between the second side surface and the bottom surface that is generated during application of the voltage between the first electrode and the second electrode, the first side surface continuing a first surface of the second glass substrate, the first surface opposing a second surface of the second glass substrate that is disposed at the first substrate side.

2. The optical filter according to claim 1,
the second glass substrate containing quartz.

3. The optical filter according to claim 1,
the second electrode overlapping to the groove when viewed from the second glass substrate side to the first glass substrate side.

4. The optical filter according to claim 1,
the first side surface being disposed between the second mirror and the second side surface when viewed from the second glass substrate side to the first glass substrate side.

5. The optical filter according to claim 1,
the first side surface and the second side surface being inclined such that a width of an opening of the groove is larger than a width of the bottom surface.

6. The optical filter according to claim 1,
a boundary of the first surface and the first side surface being circular when viewed from the second glass substrate side to the first glass substrate side.

7. An optical filter comprising:
a first substrate;
a second substrate that is disposed so as to oppose the first substrate;
a first mirror that is disposed between the first substrate and the second substrate;
a second mirror that is disposed between the first mirror and the second substrate;
a first electrode that is disposed between the first substrate and the second substrate; and
a second electrode that is disposed between the first electrode and the second substrate, the second substrate having a groove that surrounds the second mirror when viewed from a second substrate side to a first substrate side, the groove including a first side surface, a second side surface, a bottom surface, a first curved surface located between the first side surface and the bottom surface, and a second curved surface located between the second side surface and the bottom surface, the first curved surface being configured for easing a first stress concentration of the second substrate that is located between the first side surface and the bottom surface and that is generated during application of a voltage between the first electrode and the second electrode, the second curved surface being configured for easing a second stress concentration of the second substrate that is located between the second side surface and the bottom surface that is generated during application of the voltage between the first electrode and the second electrode, the first side surface continuing a first surface of the second substrate, the first surface opposing to a second substrate of the second substrate that is disposed at the first substrate side.

8. The optical filter according to claim 7,
the second substrate being a glass.

9. An analytical instrument comprising the optical filter according to claim 1.

10. An analytical instrument comprising the optical filter according to claim 7.

11. The optical filter according to claim 1, the second electrode entirely overlapping the bottom surface of the groove, in a plan view of the optical filter.

12. The optical filter according to claim 7, the second electrode entirely overlapping the bottom surface of the groove, in a plan view of the optical filter.

* * * * *